(12) United States Patent
Fujimura et al.

(10) Patent No.: US 11,921,420 B2
(45) Date of Patent: Mar. 5, 2024

(54) METHOD AND SYSTEM FOR RETICLE ENHANCEMENT TECHNOLOGY

(71) Applicant: D2S, Inc., San Jose, CA (US)

(72) Inventors: Akira Fujimura, Saratoga, CA (US);
Nagesh Shirali, San Jose, CA (US);
Ajay Baranwal, Dublin, CA (US)

(73) Assignee: D2S, Inc., San Jose, CA (US)

( * ) Notice: Subject to any disclaimer, the term of this patent is extended or adjusted under 35 U.S.C. 154(b) by 0 days.

(21) Appl. No.: 18/157,425

(22) Filed: Jan. 20, 2023

(65) Prior Publication Data

US 2023/0244137 A1 Aug. 3, 2023

Related U.S. Application Data

(60) Provisional application No. 63/267,249, filed on Jan. 28, 2022.

(51) Int. Cl.
*G03F 1/36* (2012.01)
*G03F 1/22* (2012.01)

(52) U.S. Cl.
CPC . *G03F 1/36* (2013.01); *G03F 1/22* (2013.01)

(58) Field of Classification Search
CPC ..................................... G03F 1/36; G03F 1/22
USPC ......................................................... 716/53
See application file for complete search history.

(56) References Cited

U.S. PATENT DOCUMENTS

| | | | | |
|---|---|---|---|---|
| 6,548,224 B1* | 4/2003 | Chen | ........................ | G03F 1/36 |
| | | | | 430/311 |
| 7,369,697 B2* | 5/2008 | Starikov | ............... | G06T 7/0006 |
| | | | | 702/182 |
| 2003/0010912 A1* | 1/2003 | Archie | ................ | G03F 7/70641 |
| | | | | 716/51 |
| 2007/0033558 A1* | 2/2007 | Nakagawa | ............ | G06F 30/398 |
| | | | | 716/115 |
| 2014/0141536 A1* | 5/2014 | Levinski | ............. | G03F 7/70683 |
| | | | | 356/399 |

(Continued)

FOREIGN PATENT DOCUMENTS

| | | | | |
|---|---|---|---|---|
| JP | 2008033277 A | * | 2/2008 | ............. G03F 1/144 |
| WO | 2020156777 A1 | | 8/2020 | |

(Continued)

OTHER PUBLICATIONS

Pearman et al., Fast all-angle Mask 3D for ILT patterning, Proc. SPIE 11327, Optical Microlithography XXXIII, Mar. 2020, 9 pages.

(Continued)

*Primary Examiner* — Suresh Memula
(74) *Attorney, Agent, or Firm* — MLO, a professional corp.

(57) ABSTRACT

Methods incorporate variable side wall angle (VSA) into calculated patterns, using a mask 3D (M3D) effect. Embodiments include inputting a mask exposure information, calculating a mask 2D (M2D) effect from the mask exposure information, and determining the M3D effect from the M2D effect. Determining the M3D effect may include determining the VSA, such as by using a neural network. Embodiments may include determining a dose margin from mask exposure information; calculating a VSA using the dose margin; and calculating a pattern on a substrate using the calculated VSA, wherein calculating the pattern on the substrate includes a mask 3D effect.

18 Claims, 14 Drawing Sheets

(56) References Cited

U.S. PATENT DOCUMENTS

| | | | |
|---|---|---|---|
| 2016/0078166 A1* | 3/2016 | Ünal | G06F 30/398 |
| | | | 716/51 |
| 2016/0178351 A1* | 6/2016 | Amit | G01N 21/956 |
| | | | 356/243.1 |
| 2016/0357099 A1* | 12/2016 | Kim | G03F 1/22 |
| 2018/0341173 A1* | 11/2018 | Li | G03F 1/36 |
| 2019/0187570 A1* | 6/2019 | Mack | H01J 37/222 |
| 2019/0272623 A1* | 9/2019 | Mack | G03F 1/36 |
| 2020/0012196 A1 | 1/2020 | Liu et al. | |
| 2020/0380362 A1 | 12/2020 | Cao et al. | |

FOREIGN PATENT DOCUMENTS

| | | | |
|---|---|---|---|
| WO | 2021083608 A1 | 5/2021 | |
| WO | 2021175570 A1 | 9/2021 | |

OTHER PUBLICATIONS

International Search Report and Written Opinion dated Apr. 24, 2023 for PCT Patent Application No. PCT/IB2023/050511.

* cited by examiner

METHOD AND SYSTEM FOR RETICLE ENHANCEMENT TECHNOLOGY

This application claims priority to U.S. Provisional Patent Application No. 63/267,249, entitled "Method for Reticle Enhancement Technology," filed on Jan. 28, 2022, which is hereby incorporated by reference in its entirety.

BACKGROUND

Submicron manufacturing uses lithographic techniques to build up layers of materials on a substrate to create transistors, diodes, light-emitting diodes (LEDS), capacitors, resistors, inductors, sensors, wires, optical wires, microelectromechanical systems (MEMS) and other elements which collectively produce a device that serves some function. Substrate lithography is a printing process in which a mask, sometimes called a reticle, is used to transfer patterns to a substrate to create the device. In the production or manufacturing of a device, such as an integrated circuit or a flat panel display, substrate lithography may be used to fabricate the device. When the device to be created is an integrated circuit, typically the substrate is a silicon wafer. In creating an integrated circuit, the lithography is semiconductor lithography which for high volume production is typically a substrate lithography. Other substrates could include flat panel displays, liquid panel display, a mask for flat panel display, nanoimprint masters, or other substrates, even other masks.

In semiconductor lithography, the mask or multiple masks may contain a circuit pattern corresponding to an individual layer, or a part of a layer in multiple patterning processes, of the integrated circuit. This pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices, which may be integrated circuits, will be present on the substrate. These devices may then be separated from one another by dicing or sawing and then may be mounted into individual packages.

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit (I.C.). Other substrates could include flat panel displays, holographic masks, or even other reticles. While conventional optical lithography uses a light source having a wavelength of 193 nm, extreme ultraviolet (EUV) or X-ray lithography are also considered types of optical lithography in this application. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, directed self-assembly (DSA) guard bands, or magnetic recording heads. Conventional optical lithography writing machines typically reduce the photomask pattern by a factor of four during the optical lithographic process. Therefore, patterns formed on the reticle or mask must be four times larger than the size of the desired pattern on the substrate or wafer.

Optical lithography, when using 193 nm light waves, works with refractive optics and transmissive photomasks or reticles. The masks block, partially block, or transmit the light waves selectively onto a substrate, which is typically resist-coated during the lithographic process, to partially expose or to expose different parts of the substrate or some material on the substrate. The masks are typically at 4× magnification of the target substrate dimensions.

Extreme Ultraviolet Lithography (EUV) uses approximately 13.5 nm wavelength light with reflective optics. Some implementations use an anamorphic mask with magnifications of 8× in one dimension and 4× in the other dimension.

In general, smaller wavelengths of light are able to resolve finer geometries, finer spaces in between geometries, and a higher frequency (density) of features on the substrate. Also in general, smaller wavelengths of light are more difficult to reliably produce and control. Economically, it is best to use the largest wavelength of light that is able to resolve the feature sizes, spaces, and frequencies that are needed for the device. It is therefore of interest to enhance the resolution achievable on the substrate with any given wavelength of light.

For any lithography of a particular resolution, additional techniques such as off-axis illumination, phase shift masks, and multiple patterning extend the resolution capabilities. When multiple patterning is used, a single substrate layer is exposed multiple times, each time using a different mask, which is called a mask layer.

In lithography the lithographic mask or reticle comprises geometric patterns corresponding to the circuit components to be fabricated on a substrate. The patterns used to manufacture the reticle may be generated utilizing computer-aided design (CAD) software or programs. In designing the patterns, the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce the original circuit design on the substrate by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in conventional optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs." Serifs are small features that can be positioned on an interior or exterior corner of a pattern to sharpen the corner in the final transferred image. It is often the case that the precision demanded of the surface manufacturing process for SRAFs is less than the precision demanded for patterns that are intended to print on the substrate, often referred to as main features. Serifs are a part of a main feature. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of main features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a main feature size. Note that for clarity, variations in the design of the OPC are what is being referenced. Manufacturing variations such as corner rounding will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range. There are numerous manufacturing factors that also cause variations, but the OPC component of that overall error is often in the range listed. OPC shapes such as sub-resolution assist features are subject to various design rules, such as a rule based on the size of the smallest feature that can be transferred to the wafer using optical lithography. As process nodes continue to shrink, the size of the smallest SRAFs on a photomask also shrinks. For example, at the 20 nm logic process node, 40 nm to 60 nm SRAFs are needed on the mask for the highest precision layers.

Inverse lithography technology (ILT) is a process in which a pattern to be formed on a reticle is directly computed from a pattern which is desired to be formed on a substrate such as a silicon wafer. This may include simulating the optical lithography process in the reverse direction, using the desired pattern on the substrate as input. ILT-computed reticle patterns may be purely curvilinear—i.e., completely non-rectilinear—and may include circular, nearly circular, annular, nearly annular, oval and/or nearly oval patterns. Since these ideal ILT curvilinear patterns are difficult and expensive to form on a reticle using conventional techniques, rectilinear approximations or rectilinearizations of the curvilinear patterns may be used. The rectilinear approximations decrease accuracy, however, compared to the ideal ILT curvilinear patterns. Additionally, if the rectilinear approximations are produced from the ideal ILT curvilinear patterns, the overall calculation time is increased compared to ideal ILT curvilinear patterns. In this disclosure ILT, OPC, source mask optimization (SMO), and computational lithography are terms that are used interchangeably.

EUV optical lithography has a much higher resolution than conventional optical lithography. The very high resolution of EUV significantly reduces the need for OPC processing, resulting in lower mask complexity for EUV than for 193 nm optical lithography. However, because of the very high resolution of EUV, imperfections in a photomask, such as excessive line edge roughness (LER), will be transferred to the wafer. Therefore, the accuracy requirements for EUV masks are higher than those for conventional optical lithography. Additionally, even though EUV mask shapes are not complicated by the addition of complex SRAFs or serifs required for conventional 193 nm lithography, EUV mask shapes are complicated by an addition of some complexities unique to EUV manufacturing. Of particular relevance in writing patterns on masks for EUV lithography is mid-range scattering of charged particles such as electrons, which may affect a radius of about 2 µm. This midrange scattering introduces a new consideration for mask data preparation, because for the first time the influence from neighboring patterns has significant impact on the shape that a particular pattern would cast onto the mask surface. Previously, when exposing masks for use with conventional 193 nm lithography, the short-range scattering affected only the pattern being written, and the long-range scattering had a large enough effective range that only the size of a pattern, and not its detailed shape, was affected, making it possible to make corrections by only using dose modulation. In addition, since EUV processing of wafers is more expensive, it is desirable to reduce or eliminate multiple patterning. Multiple patterning is used in conventional optical lithography to allow exposure of small features by exposing patterns for one layer of wafer processing using multiple masks, each of which contains a portion of the layer pattern. Reducing or eliminating multiple exposures requires the single mask to contain more fine patterns. For example, a series of collinear line segments maybe double-patterned by first drawing a long line, then cutting the line into line segments by a second mask in conventional lithography. The same layer written with a single mask, such as for EUV lithography, would require a mask containing many smaller line segments. The need to write larger numbers of finer patterns on a single mask, each pattern needing to be more accurate, increases the need for precision on EUV masks.

Masks created by electron beam (eBeam) machines, which shoot electrons at a photoresist coating a surface, are then processed to produce the desired openings in the mask. The amount of energy delivered to a spot on the mask is called the dose, which may have no energy at a dose set to 0.0 and a nominal dose set to 1.0 by convention. A pattern will be registered when the dose exceeds a certain threshold, which is often near 0.5 by convention. Critical dimension (CD) variation is, among other things, inversely related to the slope of a dosage curve at the resist threshold; which is called edge slope or dose margin.

There are a number of technologies used by eBeam machines. Three common types of charged particle beam lithography are variable shaped beam (VSB), character projection (CP), and multi-beam projection (MBP). The most commonly used system for leading edge mask production is VSB. VSB and CP are sub-categories of shaped beam charged particle beam lithography, in which an electron beam is shaped by a series of apertures and steered to expose a resist-coated surface. MBP uses plurality of charged particle beams whereas VSB and CP machines typically have a single beam.

When transferring the mask pattern to the substrate using substrate lithography, it is difficult to print features whose size is similar to or smaller than the wavelength of the light used for lithography. The industry has applied various techniques to address the difficulty of reliably printing a desired shape on the substrate. A computational lithography field has emerged to use computing to enhance the substrate lithography, which in semiconductor lithography is also referred to as wafer lithography. Reticle Enhancement Technologies (RET) include computational methods and systems to design the target reticle shapes which will project the desired pattern on the substrate more precisely and more reliably across manufacturing variation. RET often use computation to enhance an image on a mask, to print a desired substrate pattern more accurately and more reliably with resilience to manufacturing variation. The two common techniques in RET are Optical Proximity Correction (OPC) and Inverse Lithography Technology (ILT). OPC and ILT are often iterative optimization algorithms that adjust parameters defining the mask until the predicted pattern on wafer is within acceptable tolerances for a set or a range of conditions. OPC manipulates mask geometries and simulates the wafer pattern near target edges. ILT manipulates the mask transmission as pixels, and ILT typically simulates the entire wafer pattern, a process known as dense simulation. An iterative optimization algorithm typically consists of: (1) evaluate a proposed solution to assign a cost which is trying to be minimized; (2) if cost is below a cost criteria, stop; (3) calculate a gradient for each element of the proposed solution which would lead to a lower cost; (4) adjust the proposed solution according to the calculated gradients; (5) go back to (1). Costs are typically defined with positive values where zero is the best possible score as assumed here. However, alternative cost definitions may be used.

RET in general means to improve the printability of all desired features at nominal (expected) manufacturing conditions and within expected manufacturing variation around the nominal manufacturing conditions. Since manufacturing processes are not perfect, the design needs to be resilient to certain expected manufacturing variation. A larger process window means more resiliency to manufacturing variation, specifically that pattern discrepancies through defocus and dose variation are within an acceptable tolerance. Providing sufficient process window for as many of the features as possible is a goal of RET. The percentage of chips that function as specified after fabrication is often referred to as the yield. Many factors affect yield. Improving the process window is generally considered by those skilled in the art to correlate to improving yield.

SUMMARY

In embodiments, a method for reticle enhancement technology (RET) for transferring a pattern to a substrate includes inputting a mask exposure information, the mask exposure information comprising information to expose the pattern on the substrate. A mask two-dimensional (2D) effect ("M2D effect") is calculated from the mask exposure information. The method further comprises using a neural network to determine a mask three-dimensional (3D) effect ("M3D effect") from the M2D effect, wherein determining the M3D effect includes determining a variable side wall angle (VSA); calculating a calculated pattern on the substrate using the M3D effect; and modifying the mask exposure information based on the calculated pattern on the substrate.

In embodiments, a method for calculating a pattern to be formed on a substrate using optical lithography with a mask includes inputting a mask exposure information that will form the pattern on the mask; determining a dose margin from the mask exposure information; calculating a variable side wall angle (VSA) using the dose margin; and calculating the pattern on the substrate using the VSA, wherein the calculating the pattern on the substrate includes a mask 3D (M3D) effect.

In embodiments, a system for reticle enhancement technology (RET) comprises a device configured to receive a mask exposure information, the mask exposure information comprising information to expose a pattern on a substrate; a device configured to calculate a mask 2D (M2D) effect from the mask exposure information; a device configured to use a neural network to determine a mask 3D (M3D) effect from the M2D effect, wherein determining the M3D effect includes determining a variable side wall angle (VSA); and a device configured to calculate a calculated pattern on the substrate using the M3D effect.

DETAILED DESCRIPTION

In this disclosure, use of the term wafer lithography shall refer to substrate lithography in general. That is, embodiments shall be described in terms of semiconductor lithography as an example to simplify comprehension, but the embodiments apply also to other types of substrate lithography and to overall reticle enhancement technology. The term "substrate" in this disclosure can refer to a mask used in lithography, a silicon wafer, flat panel displays, a liquid panel display, a mask for flat panel display, nanoimprint masters, or other substrates, or other masks.

Conventional Techniques

Figure 1:
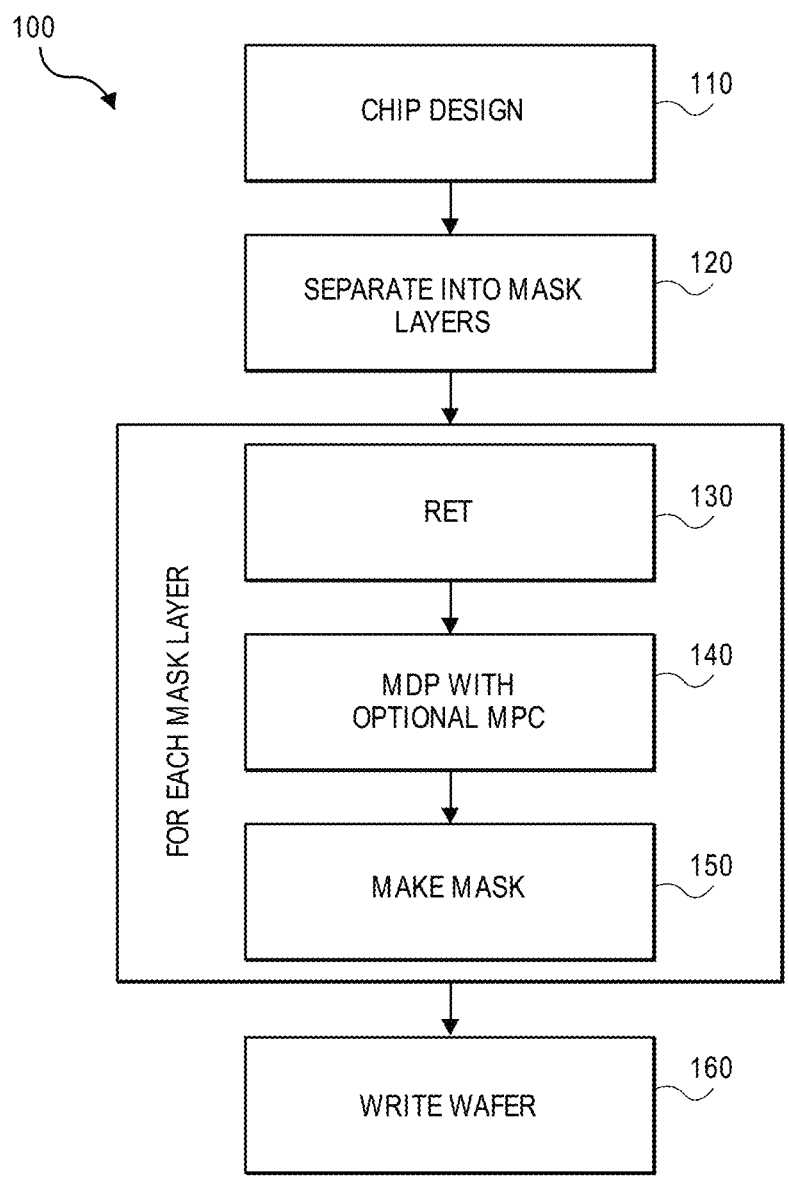
FIG. 1 is a block diagram of a chip design being processed into a wafer, as known in the art.

A traditional semiconductor manufacturing flow 100 is depicted in FIG. 1. Chip design is accomplished by creating a composite of wafer layers in step 110. In step 120, some of the wafer layers are separated into mask layers. This step also includes what is sometimes referred to as the coloring step, where each feature on a wafer layer is colored to reflect the assignment of a feature to a particular mask layer. Once the mask layers are separately identified, each mask layer may go through the RET step 130. Mask data preparation (MDP) step 140 then prepares the data for a mask writer, such as an eBeam machine. This step may include "fracturing" the data into trapezoids, rectangles, or triangles. Mask Process Correction (MPC) geometrically modifies the shapes and/or assigns dose to the shapes to make the resulting shapes on the mask closer to the desired shape. MPC may be performed in step 130, or in step 140, or in step 150, or in any combination of steps 130, 140 and 150. Pixel-level dose correction (PLDC) may also be applied in step 150. A mask is made and verified in step 150, which includes such steps as mask writing, mask inspection, metrology, mask defect disposition, mask repair, and wafer-plane inspection of the mask. In step 160, the wafer is written using the successive collection of the masks made in step 150.

In each of the steps in FIG. 1, there may or may not be a verification step to thoroughly verify or sanity check the output of that step. In the art, some of the steps of FIG. 1 may be performed in a different sequence or in parallel. An example of a pipelined processing in a semiconductor manufacturing process is when a design is divided into multiple tiles, for example an array of equal-sized tiles, and then a first step is performed for a tile, and then a second step is performed for that tile without waiting for the other tiles to finish the first step. For example, RET step 130 and MDP step 140 may be pipelined to reduce the turnaround time. In another example, the MPC of step 140 may be pipelined with the mask making of step 150.

In wafer lithography, main features are found to print with greater fidelity and improved process window if SRAFs are added to the mask that are too small to print themselves, but nevertheless favorably affect the way nearby main features print. They are isolated shapes which are unattached to a main feature, and which are small enough to not print on the substrate.

Computing SRAFs and main feature modifications is highly compute-intensive with fragile results. Spurious extra patterns may print, the target pattern may not be fitted well, and the process window may be needlessly limited. A typical RET method includes an OPC verification to identify and correct hot spots. A hot spot is an area which either 1) requires ideal process conditions to print properly, and which is therefore not resilient to manufacturing variation, or 2) will not print properly even in ideal process conditions. Hot spots lead to poor yield.

For purposes of this disclosure, a shot is the exposure of some surface area over a period of time. The area may be comprised of multiple discontinuous smaller areas. A shot may be comprised of a plurality of other shots which may or may not overlap, and which may or may not be exposed simultaneously. A shot may comprise a specified dose, or the dose may be unspecified. Shots may use a shaped beam, an unshaped beam, or a combination of shaped and unshaped beams. In this disclosure, a charged particle beam system which has a plurality of individually controllable beamlets is called a multi-beam system. In some embodiments, charged particles from a single source may be sub-divided to form a plurality of beamlets. In other embodiments a plurality of sources may be used to create the plurality of beamlets. A set of exposure information may comprise one or more shots to expose a mask used in semiconductor lithography.

Figure 2B:
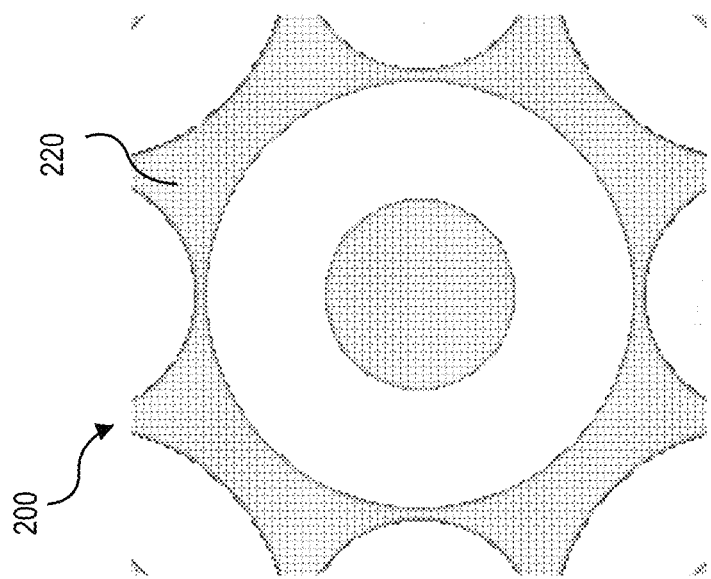
FIG. 2A and FIG. 2B show an example of VSB shots vs. multi-beam shots, as known in the art.
Figure 2A:
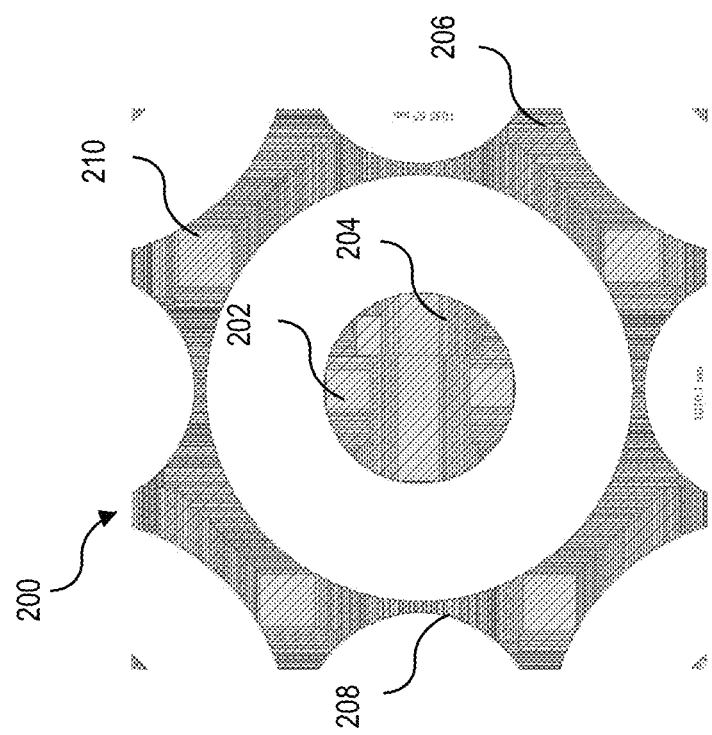

ILT often generates unexpected—i.e., non-intuitive—mask patterns which provide excellent results. ILT algorithms naturally create curvilinear shapes which include many SRAFs. ILT algorithms targeted for VSB therefore spend considerable runtime to convert the curvilinear shapes into an approximation that is more suitable for VSB writing, a process often referred to as Manhattanization, creating rectangles for each VSB shot 202, 204, 206, 208 and 210, for example, as shown in FIG. 2A. Curvilinear shapes have proven to be impractical for variable shaped beam (VSB) mask writing machines with conventional fracturing because very many VSB shots such as shots 202-210 are required to expose the curvilinear shapes. For example, as shown in FIG. 2A, pattern 200 is a curvilinear shape formed from a plurality of VSB shots such as shots 202-210. Mask write times are a critical business factor, and VSB writing time scales with the number of VSB shots that need to be printed.

Curvilinear shapes take longer to write using VSB and Manhattanized shapes. FIG. 2B shows how multi-beam eBeam machines write curvilinear shapes directly on a mask without taking any additional time. A multi-beam system is a charged particle beam system that has a plurality of individually controllable beamlets that can simultaneously expose pixels on a surface. In FIG. 2B, each pixel 220 of pattern 200 is exposed by a beamlet of a multi-beam writer. Multi-beam enables ILT to output curvilinear shapes without the need for Manhattanization.

Multi-beam writing eliminates the need to Manhattanize curvilinear shapes for VSB writing. But mask printability and resilience to manufacturing variation are still important considerations for mask shapes output by ILT. For example, shapes that are too small or too close to each other, or have too sharp a turn in the contours of the shapes make it too difficult to make the masks reliably, especially across manufacturing variation.

The energy delivered by the electrons from an eBeam machine when exposing a mask pattern is often approximated as a point-spread function (PSF). While there are many effects that affect how the energy is spread, in eBeam-based mask making—either for variable shaped beam or for multi-beam writing—a monotonic continuous PSF is a reasonable representation of the energy distribution. In this disclosure, for ease of comprehension, a simple single Gaussian distribution will be used as the PSF, but the embodiments apply to any suitable PSF.

When energy is delivered across a big enough area at nominal dose in a Gaussian distribution, there is ample dose for the interior of the area to reach nominal dose. However, if the area is sufficiently small, the highest dose in the interior of the area will be less than nominal dose. Similarly, if the spacing between areas is large enough, the lowest dose reaches zero. But if the spacing is sufficiently small, the lowest dose will not reach zero. When either the areas or the spacing between the areas is small, the dose profile is shallow. Mask manufacturing processes are designed to provide ample dose margin for a reasonable area and spacing, for example 100 nm lines separated by 100 nm spaces with nominal dose for a typical leading-edge mask for 193i lithography. Smaller areas and spacings will have lower dose margin at the contour edges of the areas. The smaller the area, the worse the dose margin, for a constant dose.

Dose margin is also reduced for a typical mask writing process because of proximity effect correction (PEC). Mask writing with eBeam, whether VSB, CP, or MBP, has a backscatter effect that is well known in the art. Electrons hit the resist surface, and secondary electrons released by the electrons bounce around to expose the resist within a 10 micrometer scale area around the exposed location. This has the effect of partially exposing the resist in the surrounding 10 micrometer scale area. Backscatter scattering is considered a long-range effect. The aggregate of these partial exposures from all exposures surrounding a given area is significant enough to require correction. Software-based correction for backscatter and other long-range effects is called PEC and is typically applied in line with the mask writer at the time of mask writing. PEC in essence decreases the nominal dose of a shot (or a pixel in the case of MBP) to compensate for the aggregate backscatter dosing from the surrounding shots (or pixels). Nearly all production masks are written with PEC turned on in the machine. When the dose density of a 10 micrometer scale area is high, the amount of PEC applied is also high. This has the effect of reducing the height of the Gaussian (or PSF) of the exposure, and therefore reduces dose margin at the contour edges in that dense area. Therefore, a small shape written in an area of high dose density will have worse dose margin than the same sized shape written in an area of low dose density.

Dose margin matters because a low dose margin means that a given percent dose change will result in a larger difference in CD. Since dose margin is known by those skilled in the art to be a good proxy for a large variety, if not majority, of sources of manufacturing variation, measuring CD variation against dose variation is an important measure of resilience to manufacturing variation.

Mask Process Correction, which may be performed offline, pipelined, or in line with the mask writer, may manipulate shapes or doses applied to the mask in order to correct for linearity and enhance critical dimension uniformity (CDU) and line-edge roughness (LER) among other measures of resilience to manufacturing variation. Improving CDU and LER includes enhancement of dose margin, and improving the uniformity of dose margin across features in the mask. Enhancement of dose margin (edge slope) is disclosed in U.S. Pat. No. 8,473,875, "Method and System for Forming High Accuracy Patterns Using Charged Particle Beam Lithography", which is owned by the assignee of the present application.

In a typical semiconductor manufacturing process, RET of step 130 in FIG. 1 produces a target mask. When a mask representation does not automatically satisfy all desired mask constraints and characteristics, such as allowed transmission values, minimum feature size, minimum spacing, or sufficient dose margin among others, an evaluation of a mask's suitability needs to introduce terms that add a cost related to the violation of these constraints. In the field of inverse problems, introducing these terms is known as regularization, and is a means of selecting a solution from a potentially infinite set of solutions that fits the desired outcome equally or similarly well, but which also has other a priori desirable properties. An example of Inverse Lithography Technology (ILT) is disclosed in U.S. Pat. No. 10,657, 213, "Modeling of a Design in Reticle Enhancement Technology", which is owned by the assignee of the present disclosure and is hereby incorporated by reference.

Semiconductor manufacturing and submicron manufacturing in general has followed Moore's Law, which predicts that the manufacturing pieces of infrastructure advances together to allow the resolution to improve at a relatively predictable and steady rate over time. An important aspect of Moore's Law is that computational capabilities of the infrastructure scale along with Moore's Law. This is because effects relative to power consumption and cost—such as computing bandwidth, computing speed, memory capacity, memory access speeds, communication bandwidth, communication speed, long-term storage (whether solid-state or hard-disk) capacity and speed—also scale on Moore's Law. Introduction of new manufacturing technologies such as EUV lithography or MBP-based mask writing create a discontinuity in the computing requirements. Introduction of new computational technologies such as graphical processing unit (GPU) acceleration also create a discontinuity in the computing capabilities and scalability.

DETAILS OF PRESENT EMBODIMENTS

This disclosure describes a technique for determining mask 3D (M3D) effect. Using this technique includes calculating a variable side wall angle (VSA) along contours on the mask. Using the VSA, the substrate pattern can be calculated more accurately than if a constant side wall angle is assumed as in conventional techniques. This allows the pattern on the substrate to be created more accurately, thus enabling a higher yielding production.

Typical ILT goes through a continuous tone mask to define a greyscale mask for the best process window, followed by a conversion into actual mask geometries, which are typically Manhattanized to be compatible with printing on VSB mask writers. On mask, however, the features to be printed are not Manhattan, and the present disclosure demonstrates that, by not taking into account the actual mask shapes, current Manhattan mask 3D (M3D) approximations using width, shape, and corner libraries, give rise to poor predictions for the final aerial image.

Inverse lithography technology (ILT) has long been seen as the best way to maximize the overall process window for immersion lithography. Traditionally, ILT patterns would be Manhattanized as part of a final optimization step, but with the advent of MBP mask writers, that is no longer necessary. A deep-learning approach using convolutional neural networks (CNN) can be implemented to accelerate the M3D calculation.

Current state of the art for M3D correction in ILT or OPC assumes a constant given side wall angle for every shape on the mask. M3D is the accounting of the thick mask effect to adjust the lithography simulation result. The difference in predicted wafer contour between contours assuming thin mask (i.e., without M3D taken into account) and one with M3D can have as much as a 5 nm edge placement error (EPE) which would be a 10 nm critical dimension (CD) difference, for example. In leading edge nodes, ILT accuracy is typically required to be better than 1 nm accuracy, so M3D is an important effect. The importance and the need for accuracy is increased for EUV masks. The extra precision achievable by estimating the side wall angle along the contour and adjusting the M3D expectations based on the different angles enhances accuracy which is increasingly important for finer geometries.

ILT adds some extra consideration to the kind of M3D simulation necessary. First, native ILT shapes are curvilinear. If the mask design is Manhattan, there are no sharp corners on real masks. Therefore, it is important to simulate the real mask shape to get the correct effect. Furthermore, all ILT solutions go through a so-called greyscale mask (continuous tone mask, or CTM), for which it is impossible to do any sort of M3D approximation because the CTM does not reflect the real mask topology. The CTM must be quantized into actual materials to extract the shapes to feed into the M3D simulator. Regularization is a procedure and formulation that can bring a CTM to a quantized tone mask (QTM) with the methods described in U.S. Pat. No. 7,716,627, "Solution-Dependent Regularization Method for Quantizing Continuous-Tone Lithography Masks", which is owned by the assignee of the present disclosure.

Figure 3:
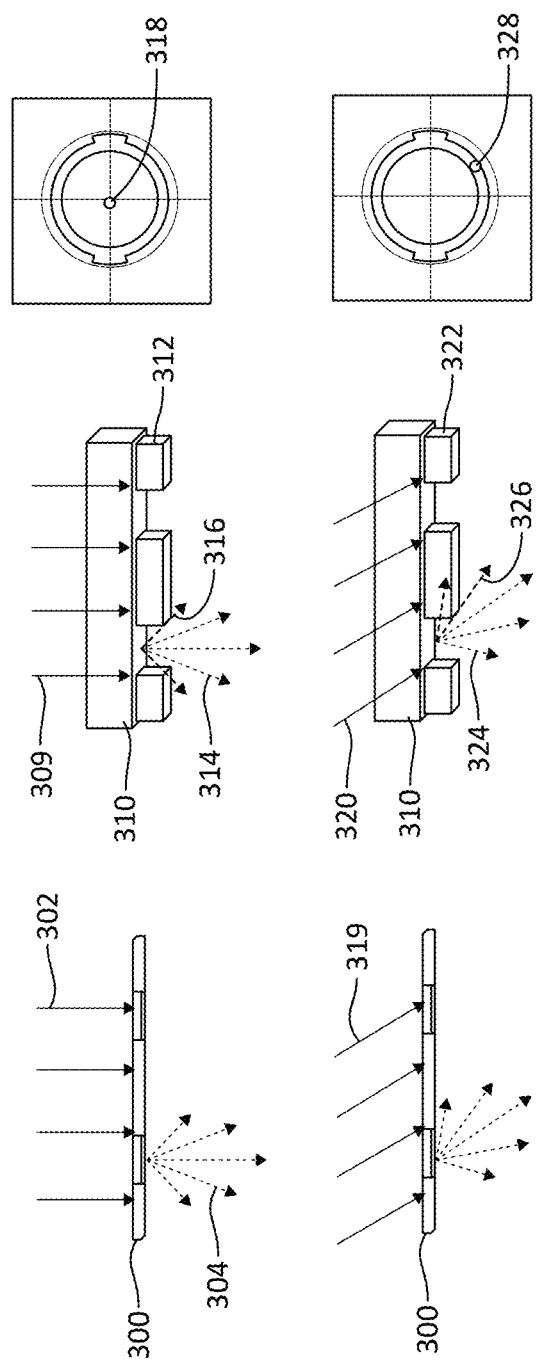
FIG. 3 illustrates Mask 3D (M3D) effect for 193i lithography, as known in the art.

FIG. 3 illustrates where thin mask, or mask 2D (M2D) effect vs. thick mask M3D effect comes from. The left-hand and middle images in each row of FIG. 3 are side views, and the right-hand images are plane views. Looking at a thin mask 300, there is an incoming plane wave of incident light from light source 318, with normal incidence 302, on the mask 300 that is presumed to be infinitely thin. Under this approximation, the diffraction orders 304 (near field) can be calculated by a simple Fourier transformation. Contrast this with a thick mask 310 (top middle image), where mask topology is taken into account. Initially, there are the same diffraction orders 314 for thick mask 310 as diffraction orders 304 for the thin mask 300. However, the standing waves of the incident light 309 on the opposite side of the mask now need to be solved for. Simple ray tracing shows that the higher diffraction orders 316 interact with the absorber material 312 of the mask more than the center-most diffraction order, introducing both a reduction in amplitude as well as a modulation of the phase compared to the ideal case in mask 300.

In the bottom set of images, off-axis incidence 319 for thin mask 300 and off-axis incidence 320 for thick mask 310 have the same effect as in the upper set of images, except from an incoming plane wave from a light source 328 that is not normally incident (off-axis illumination) on the backside of the mask. The higher right-most diffraction orders 326 interact with the absorber material 322 more than the center and left of center diffraction orders 324. In fact, this represents a source point along the annulus, and is more representative of the actual illumination, even if the normal incidence 302 from light source 318 is a typical approximation for most M3D engines for speed reasons. The effect of the incident angle serves to rotate the diffraction orders in the frequency domain. Given this, if one looks at the thick mask ray tracing, there is now a significant imbalance in the positive and negative orders, creating a complex diffraction system.

Figure 4:
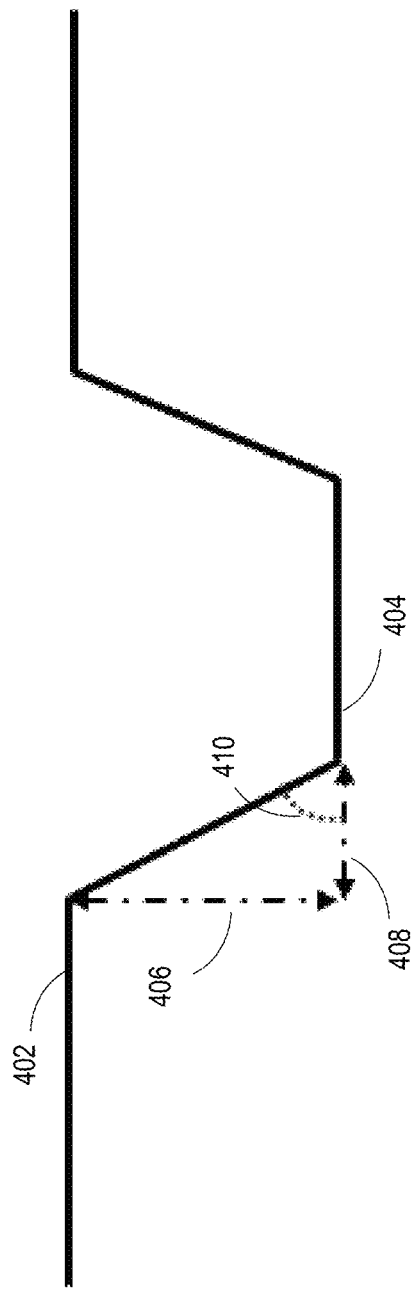
FIG. 4 illustrates side wall angle in a cross section of a mask contour, in accordance with embodiments.

The amount of shadowing can vary with a side wall angle along a contour of a shape on the mask. FIG. 4 illustrates a cross section of a thick mask. The thickness 406 is the distance from the top of the mask 402 and the base 404. A lateral distance 408 can be measured from the top edge and base. The side wall angle 410 measures the slope from base to top. The greater the distance 408 the shallower the slope of the angle, which can introduce an unintended change in the amount and phase of the energy that is expected to reach the substrate and therefore affect the pattern that is formed on the substrate.

Figure 5:
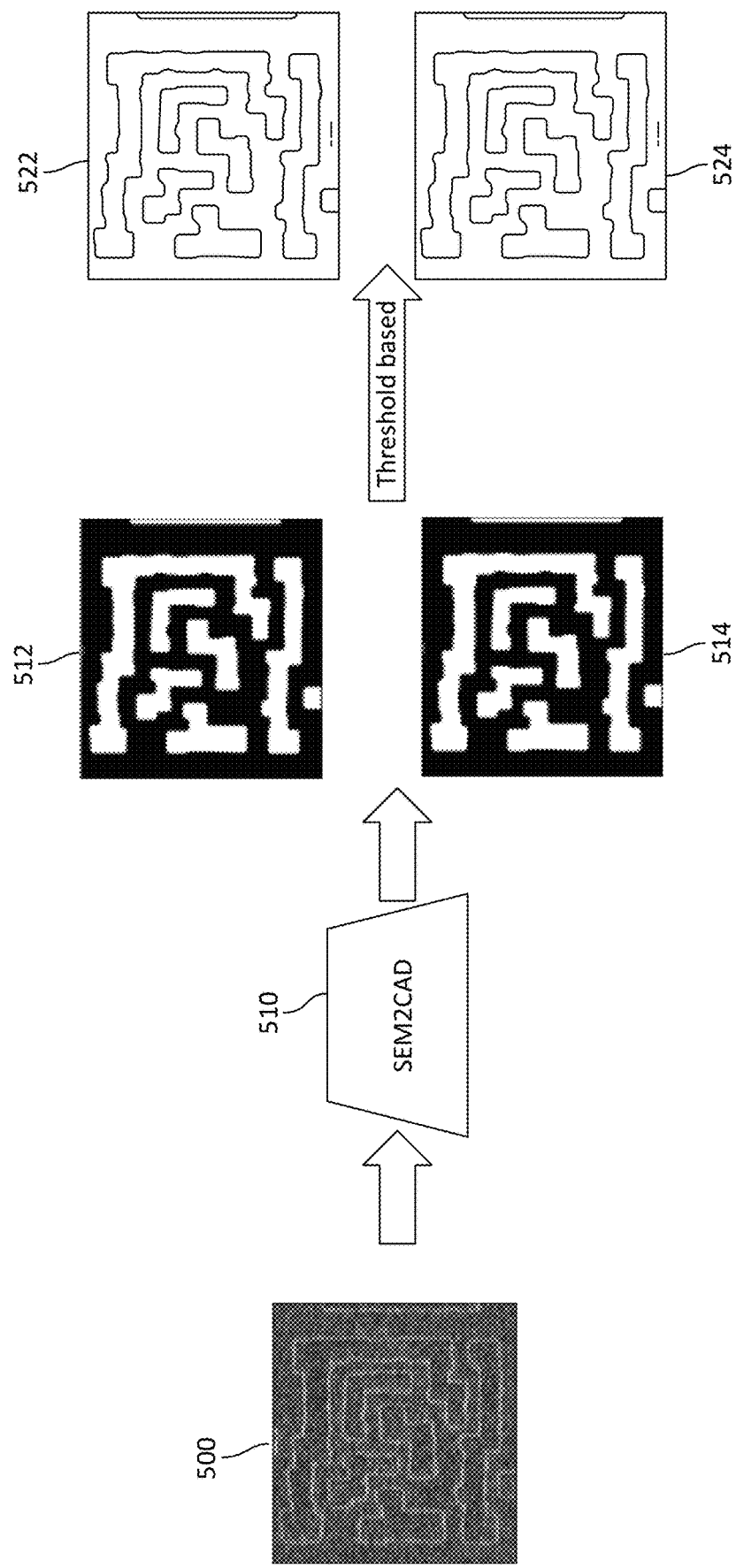
FIG. 5 illustrates a method for determining variable side wall angle (VSA), in accordance with embodiments.

FIG. 5 is a schematic of a method for determining variable side wall angle (VSA) using a neural network, in accordance with embodiments. A scanning electron microscope (SEM) image 500 is input to a neural network 510. A mask exposure information of an electronic design pattern is determined, sometimes referred to as the computer aided design (CAD) pattern. The CAD pattern is represented on a mask that would be used to expose the pattern on the substrate. A neural network can be trained to generate a CAD pattern from a SEM image using SEM, CAD pairs, generated using another neural network for generating SEM images from CAD patterns, for example as disclosed in U.S. Pat. No. 11,250,199 "Method and Systems for Generating Shape Data for Electronic Designs" owned by CDLe, a subsidiary of D2S, Inc. and incorporated by reference.

In one embodiment, the measurement of VSA may use both a top 402 and a base 404 of a thick mask as shown in FIG. 4. In FIG. 5, a dose map for a top of the mask 512 and a dose map for the bottom of the mask 514 are determined by the neural network 510. The dose maps represent the patterns that would be exposed on the masks 512 and 514. The neural network 510 may be trained to learn to output the top and bottom of a thick mask. Top contour 522 and bottom contour 524 may be obtained by setting a threshold of 0.5 where light portions of 512 and 514 are nominal dose (1.0) and dark portions are 0 dose. The side wall angle can be calculated by measuring a lateral distance (lateral distance 408 in FIG. 4) between the top contour 522 to bottom contour 524 and a predetermined thickness (thickness 406 in FIG. 4) between the top and bottom contours 522 and 524.

In another embodiment, VSA may be determined as a direct transfer from dose margin. Dose margin varies frequently on curvilinear masks from straight edges of big features to straight edges of small features to highest curvature features. This transfer is a statistical effect so local averaging may be used to determine the side wall angle at any given spot along the contour. Neural network 510 may be used to determine the side wall angle variation everywhere along the bottom contour 524. In yet another embodiment, varying width of a pattern may also contribute to VSA and may be taken into account when determining VSA. VSA may be pre-calculated and stored in a look-up table by dose margin or width for quick access; intermediate values may be interpolated.

Figure 6:
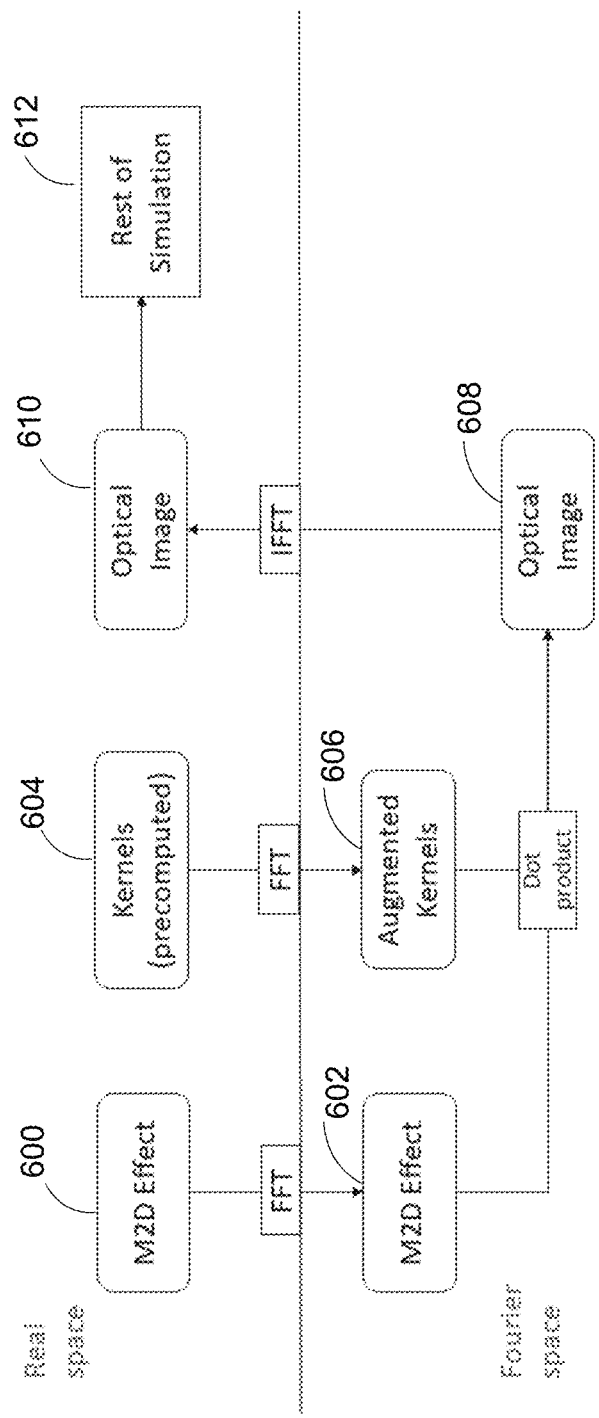
FIG. 6 illustrates a method of simulation, as known in the art.

FIG. 6 illustrates simulation of diffraction orders, or near field effects using a thin mask and further processing in Fourier space. Typically, Fast Fourier Transforms (FFT) are an efficient way to simulate an optical image 608. An M2D effect 602 in Fourier space representing an M2D effect 600 for an input mask is generated. A set of precomputed kernels 604 (in real space) of an optical model is also represented in FFT space as augmented kernels 606. The optical image 608 is generated from the dot product of the FFT M2D effect 602 and augmented kernels 606. Inverse FFT (IFFT) is performed to generate the optical image 610 in real space where further simulation (simulation 612) will generate the pattern on the substrate.

ILT is used to generate the M2D effect 602 in FIG. 6. ILT requires a model and also requires that the model to be invertible to calculate a gradient of the wafer contour with respect to a non-local mask shape or pixel. Therefore, in order for ILT to generate an M3D effect it would also need to be invertible. Typically, an M3D effect is obtained through rigorous simulation and cannot be inverted.

Figure 7:
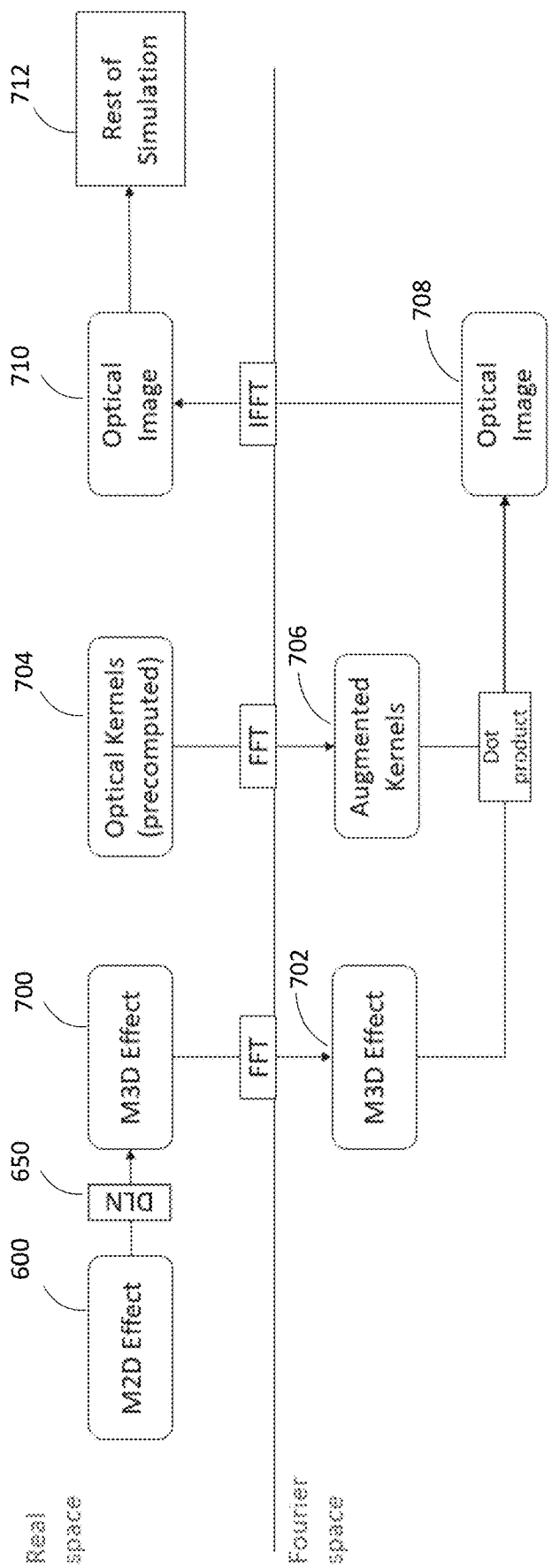
FIG. 7 illustrates a method of simulation for Mask 3D (M3D) effect using a Deep Learning Network (DLN), in accordance with embodiments.

In an embodiment, an M3D effect 700 in FIG. 7 may be inferenced from an M2D effect 600 using a deep learning network (DLN 650) prior to calculating in Fourier space to generate the optical image 708. Once the M3D effect 700 is generated in real space, simulating the optical image 708 is similar to simulating M2D effect 602 in FIG. 6. An M3D effect 702 in FFT space representing M3D effect 700 for an input mask is generated. A set of precomputed kernels 704 (in real space) of an optical model is also represented in FFT space as augmented kernels 706. The optical image 708 is generated from the dot product of the FFT M3D effect 702 and augmented kernels 706. Inverse FFT (IFFT) is performed to generate the optical image 710 in real space where further simulation (simulation 712) will generate the pattern on the substrate. In FIG. 6 and FIG. 7, the M2D and M3D effect simulations may continue to simulate the pattern on a wafer to determine the accuracy of the mask effect.

Figure 8:
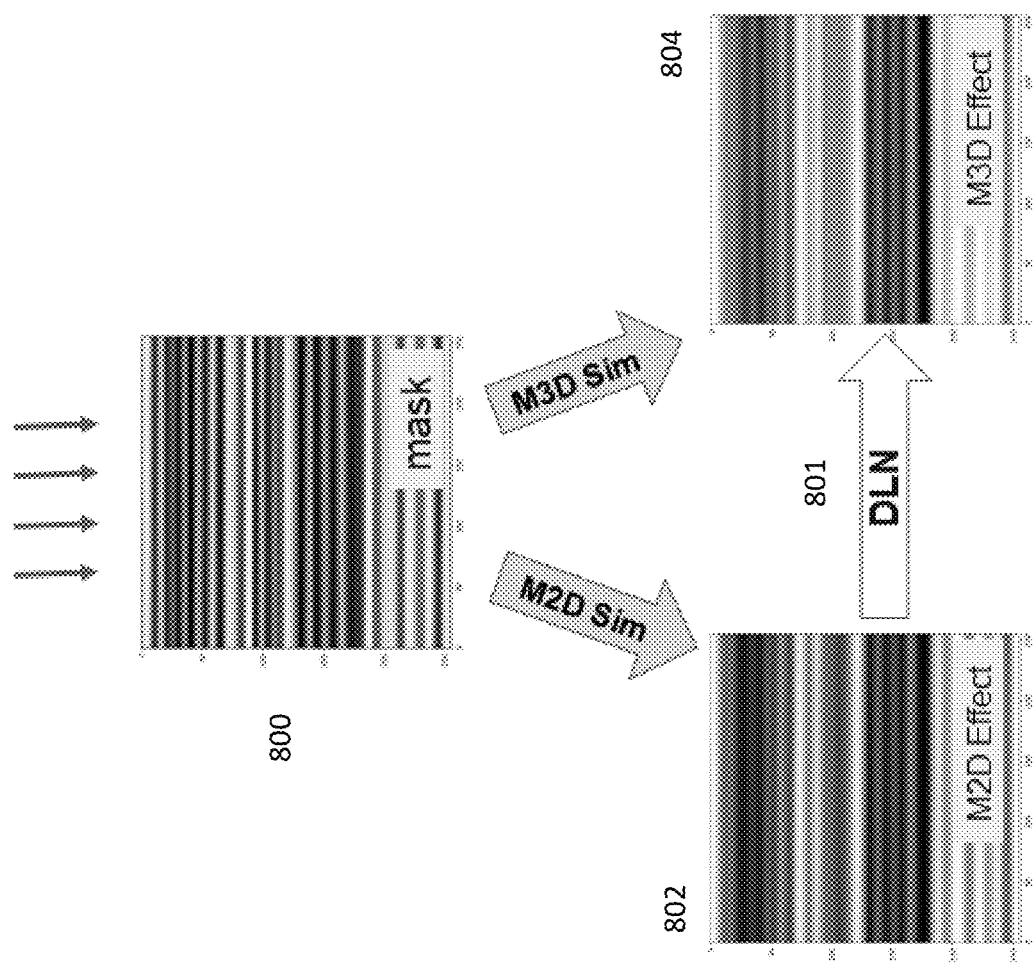
FIG. 8 illustrates a DLN for generating M3D effect from M2D effect, in accordance with embodiments.

In FIG. 8, for a mask 800, ILT simulation data of an M2D effect 802 and rigorous simulation data for M3D effect 804 are used to train a deep learning neural network 801 to learn transfer functions of the M2D effect 600 to the M3D effect 700 in FIG. 7. 193i light coming into and out of the mask may be represented by complex numbers including amplitude and phase, X-polarized light and Y-polarized light coming into the mask (Xin, Yin) and coming out of the mask (Xout, Yout). A map from XinXout for M2D to XinXout for M3D is learned during training, and likewise for YinYout. XinYout and YinXout for 193i have little impact. For EUV, all mappings from M2D to M3D are learned: XinXout, XinYout, YinYout and YinXout. Conventionally, the side wall angle is modeled as a constant. In embodiments, the optical model used to simulate the M3D effect contains variable side wall angle (VSA) so that the simulation of M3D effect takes VSA into account.

In an embodiment, a customized loss function using a magnitude of difference (of the transfer functions) $I^2 =$ $(Y^t_{real} - Y^p_{real})^2 + (Y^t_{imag} - Y^p_{imag})^2$, a root mean square error rmse_loss=$\sqrt{\text{Mean}(I^2)}$, and max_loss=$\text{Sum}((\sqrt{I^2}) > \text{th})$, is represented as:

Loss=$\alpha$*rmse_loss+$\beta$*max_loss, where alpha ($\alpha$) and beta ($\beta$) are constants. For the max_loss, pixel values greater than a threshold "th" are penalized.

Figure 9:
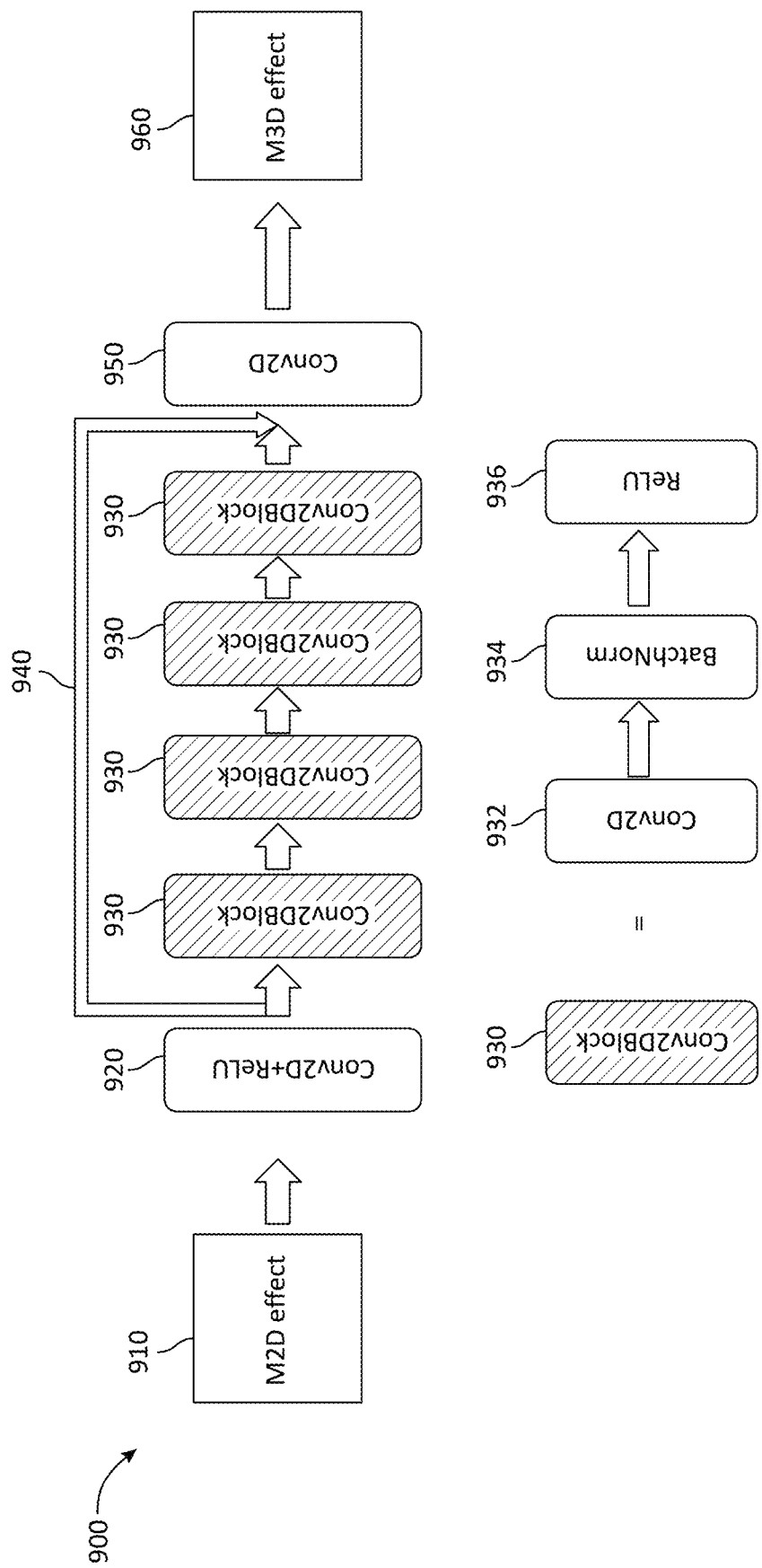
FIG. 9 illustrates a DLN for generating an M3D image from an M2D image, in accordance with embodiments.

In one embodiment, a neural network 900 trained to generate M3D mask image 960 from M2D mask effect 910 using transfer functions is shown in FIG. 9. The mask effects 910 and 960 representing mask effects of diffraction orders in the near field for M2D and M3D, respectively, have a halo size of 60 pixels in one example. The neural network 900 comprises six layers and blocks in this embodiment, the first layer 920 being a 2D convolution layer with ReLU followed by four identical 2D convolution blocks 930. The 2D convolution blocks 930 each have three layers, a 2D convolution layer 932 followed by a batch normal layer 934 and a ReLU layer 936. A skip connection 940 may be used for better gradient propagation. The image is processed through a final 2D convolution layer 950 which outputs the M3D mask image 960.

Figure 10:
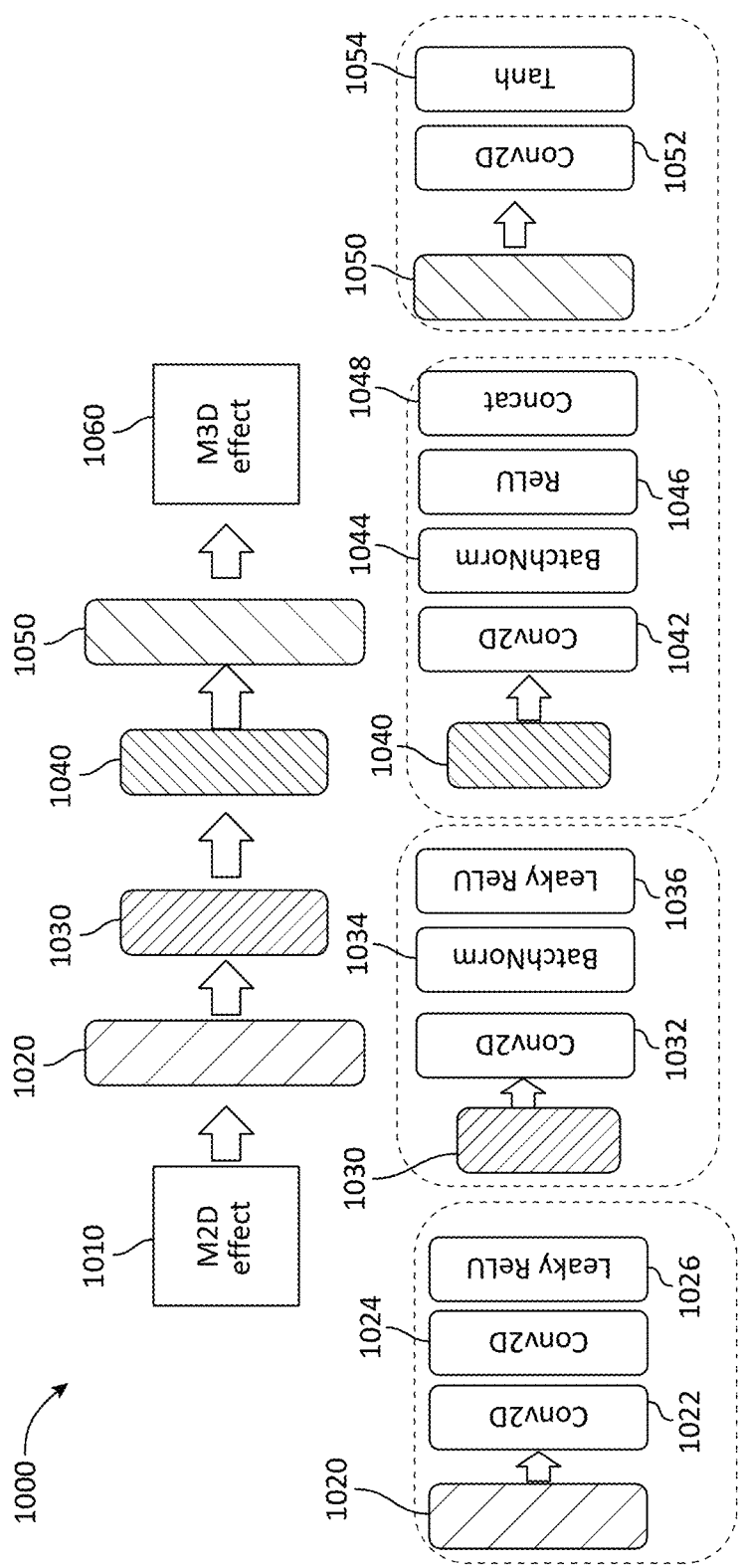
FIG. 10 illustrates another DLN for generating an M3D image from an M2D image, in accordance with embodiments.

In another embodiment, an alternate neural network 1000 for generating an M3D effect 1060 from an M2D effect 1010 using transfer functions is shown in FIG. 10. In this example configuration of FIG. 10, neural network 1000, utilizing a UNet, has four sets of convolution blocks 1020, 1030, 1040 and 1050. Convolution block 1020 has two 2D convolution layers 1022 and 1024 followed by a leaky ReLU layer 1026. Convolution block 1030 has one 2D convolution layer 1032 followed by a batch normal layer 1034 and a leaky ReLU layer 1036. Convolution block 1040 has one 2D convolution layer 1042 followed by a batch normal layer 1044, a ReLU layer 1046 and a concatenation layer 1048. Convolution block 1050 has one 2D convolution layer 1052 followed by a tanh layer 1054 and outputs the M3D image 1060. The added complexity of the differing blocks of neural network 1000 as opposed to the identical blocks in neural network 900, may be used for better accuracy in performing the transfer functions.

Calculating M3D effects to incorporate variable side wall angles into mask exposure information, as described herein, is challenging to achieve. This difficulty is evidenced by the long-standing use of constant side wall angles in conventional industry practices. Implementation of the present M3D methods compared to conventional M2D techniques is not straightforward, as the three-dimensional effects add significantly more complexity and compute-intensive processes than conventional methods. Methods and systems of the present disclosure uniquely utilize mask contours and dose margins to account for varying values of side wall angles within a mask, training and using neural networks to achieve calculations. Methods can include using simulation data of M2D and M3D effects to train a deep learning neural network, beneficially enabling the deep learning neural network to learn transfer functions of the M2D effect to the M3D effect so that calculations can be achieved in an efficient manner, thus making the implementation of VSA possible.

Figure 11:
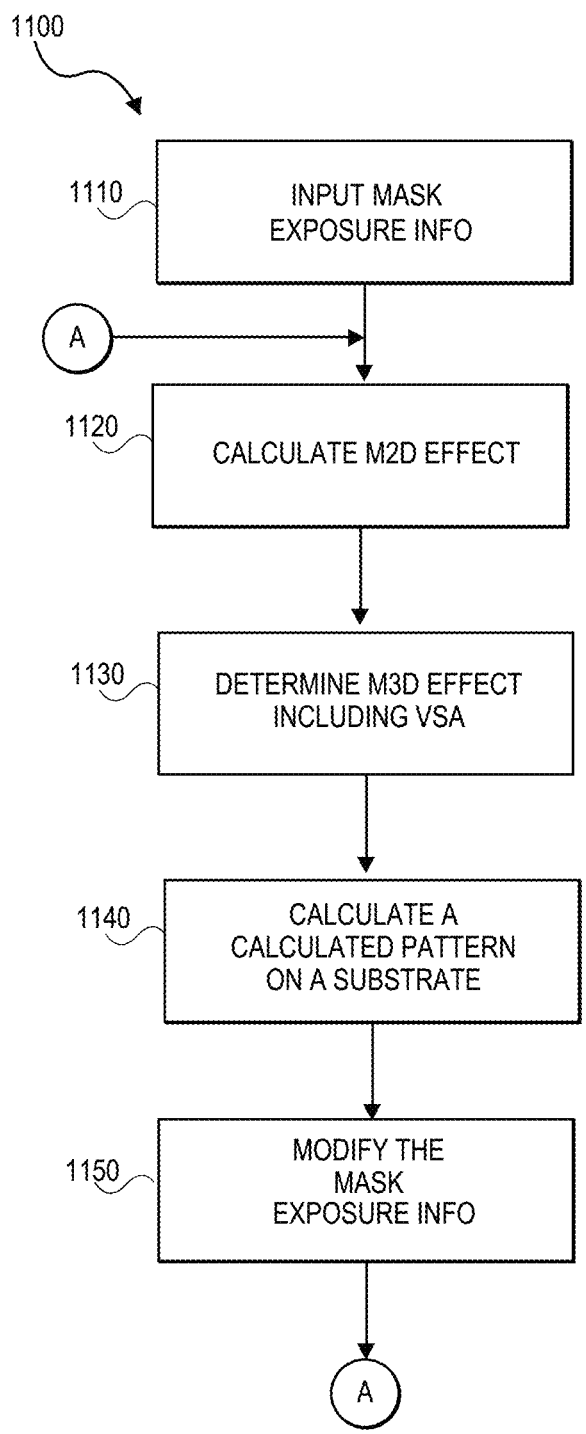
FIG. 11 is an example flow for RET, in accordance with embodiments.

FIG. 11 is an example flowchart 1100 of a method for reticle enhancement technology for transferring a pattern, such as a mask pattern, to a substrate, in accordance with embodiments of the present disclosure. In step 1110, an initial mask exposure information is input, the mask exposure information comprising information to expose the pattern on the substrate. The initial mask exposure information can comprise a first guess, such as applying a constant dose value for a mask pattern, a low-pass filter applied to a target substrate pattern, a previously determined mask pattern (e.g., a preliminary result previously computed), or a low-pass filtered mask obtained through other means (e.g., when addressing a hot spot in an existing mask design or examining a solution provided by another system). The mask exposure information may include optical proximity correction (OPC). The mask exposure information may be for multi-beam.

In step 1120, a mask 2D (M2D) effect is calculated. That is, step 1120 involves calculating an M2D effect from the mask exposure information. The calculating the M2D effect may involve inverse lithography technology (ILT). In step 1130, a mask 3D (M3D) effect is determined from the M2D effect and includes side wall angle calculations at various locations along the contour of the mask. In embodiments, step 1130 involves using a neural network to determine an M3D effect from the M2D effect, wherein determining the M3D effect includes determining a variable side wall angle (VSA). In embodiments, step 1130 includes determining a variable side wall angle (VSA) at a plurality of locations along a contour. M3D effect is known to be different in magnitude depending on the VSA. In the present methods, VSA around the contour are accounted for, rather than assuming a constant side wall angle for the whole pattern as in conventional techniques. Consequently, the M3D effect determined in step 1130 is more accurate than when using conventional techniques. In some embodiments, the calculating of the M2D effect in step 1120 includes calculating a dose margin from the mask exposure information, where determining M3D effect and the side wall angle in step 1130 may use the dose margin (e.g., determining the M3D effect includes calculating a dose margin from the mask exposure information). Determining the side wall angle may be performed using a neural network such as the neural networks of FIGS. 9 and 10. In embodiments of step 1130, determining the M3D effect uses a transfer function.

Step 1140 involves calculating a calculated pattern on the substrate using the M3D effect. Step 1140 includes calculating a pattern to be formed on the substrate using a substrate lithography system model, a resist process model and taking a more accurate M3D effect into account, the substrate pattern being within a design area. The calculating of the calculated pattern on the substrate may comprise extreme ultraviolet (EUV) simulation. In some embodiments, the substrate pattern comprises a plurality of patterns on a wafer, and the design area comprises a large section of a mask layer of a semiconductor chip, such as an entire mask layer. The substrate lithography system model is used to calculate a pattern that will be produced on the substrate by the mask.

Step 1150 includes modifying the mask pattern based on the substrate pattern; that is, modifying the mask exposure information based on the calculated pattern on the substrate. The modifying may include inverse lithography technology (ILT). The VSA may be recalculated with the modified mask pattern. The steps 1120 through 1150, including calculating the M2D effect, determining the M3D effect and modifying, may be iterated as indicated by the loop "A" until the calculated substrate pattern matches the desired substrate pattern. For example, methods may include iterating the calculating the M2D effect of step 1120, the determining the M3D effect of step 1130, the calculating of the calculated pattern of step 1140, and the modifying of step 1150.

Note that in flowchart 1100, variations are possible. For example, VSA in step 1130 may be predetermined and stored in a look-up table. Other computations could be done in steps 1140 to help iteration on the mask. In some embodiments, the flowchart 1100 further includes inputting a target substrate pattern and calculating the mask exposure information from the target substrate pattern using reticle enhancement technology (RET) prior to inputting the mask exposure information, where the RET may include inverse lithography technology.

The mask patterns may also further be processed to incorporate some MPC of mask manufacturing effects such as mask etch bias. Step 1130 may include all MPC.

Figure 12:
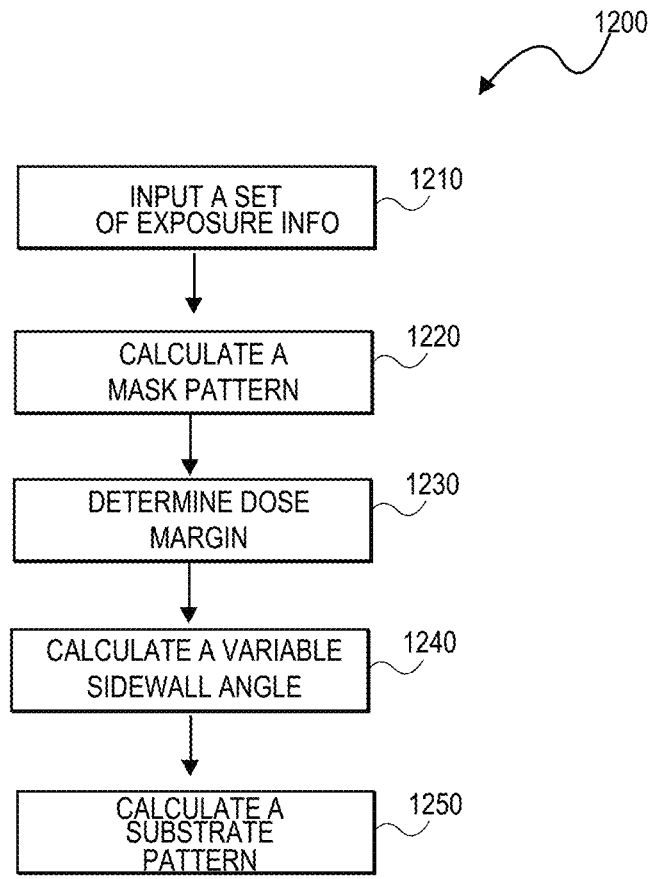
FIG. 12 is another embodiment of methods of calculating a pattern to be formed on a substrate using optical lithography with a mask, in accordance with embodiments.

FIG. 12 is a flow diagram 1200 of calculating a pattern to be formed on a substrate using optical lithography with a mask, such as how to prepare a reticle for use in fabricating a surface such as an integrated circuit on a silicon wafer, according to the present disclosure. In step 1210, mask exposure information, which may also be referred to as a set of mask exposure information, such as a set of shots or a dose map, that will form a pattern on the mask is input. The set of shots may be previously determined for example, as described in U.S. Pat. No. 9,341,936 which determines a set of shots from a desired substrate pattern.

In step 1220 a mask pattern is calculated from the set of shots. A dose margin is determined for one or more shots (set of shots) or a dose map in step 1230 from the mask exposure information. Dose margin varies frequently on curvilinear masks from straight edges of big features to straight edges of small features to the highest curvature features. Step 1240 involves calculating a variable side wall angle (VSA) using the dose margin. Side wall angle of the mask correlates with dose margin. This correlation is a statistical effect, so a local averaging to calculate a variable side wall angle at any given location along the contour may be done in step 1240 using the dose margin. In an embodiment, the variable side wall angle may be calculated using a neural network. In other embodiments, the relationship between dose margin (x) and the side wall angle (y) is linear and can be represented in a formula (i.e., a linear equation) y=a+bx, for example.

In step 1250, a pattern on a substrate is calculated from the mask pattern using the calculated variable side wall angle, wherein the calculating the pattern on the substrate includes an M3D effect. In some embodiments, calculating the pattern on the substrate comprises lithography simulation. In some embodiments, calculating the pattern on the substrate comprises extreme ultraviolet (EUV) simulation. In some embodiments, the pattern on the substrate is for a semiconductor device.

Further embodiments of flow diagram 1200 include calculating a mask from the mask exposure information, where the step of calculating the pattern on the substrate uses the mask.

Computation Systems

In embodiments, a system for reticle enhancement technology (RET) comprises a device configured to receive a mask exposure information, the mask exposure information comprising information to expose a pattern on a substrate; a device configured to calculate a mask 2D (M2D) effect from the mask exposure information; a device configured to use a neural network to determine a mask 3D (M3D) effect from the M2D effect, wherein determining the M3D effect includes determining a variable side wall angle (VSA); and a device configured to calculate a calculated pattern on the substrate using the M3D effect. In some examples, the device configured to calculate the M2D effect and the device configured to use the neural network to determine the M3D effect from the M2D effect comprises a graphics processing unit (GPU).

The computation and processing steps described in this disclosure may be implemented using general-purpose computers with appropriate computer software as computation devices. Multiple computers or processor cores may also be used in parallel. In some embodiments, a special-purpose hardware device, either used singly or in multiples, may be used to perform the computations of one or more steps with greater speed than using general-purpose computers or processor cores. In certain embodiments, the special-purpose hardware device may be a graphics processing unit (GPU). In other embodiments, other special-purpose hardware devices may be used as co-processors, such as a Digital Signal Processor (DSP), a Tensor Processing Unit (TPU), a Field-Programmable Gate Array (FPGA), or an Application-Specific Integrated Circuit (ASIC).

Figure 13:
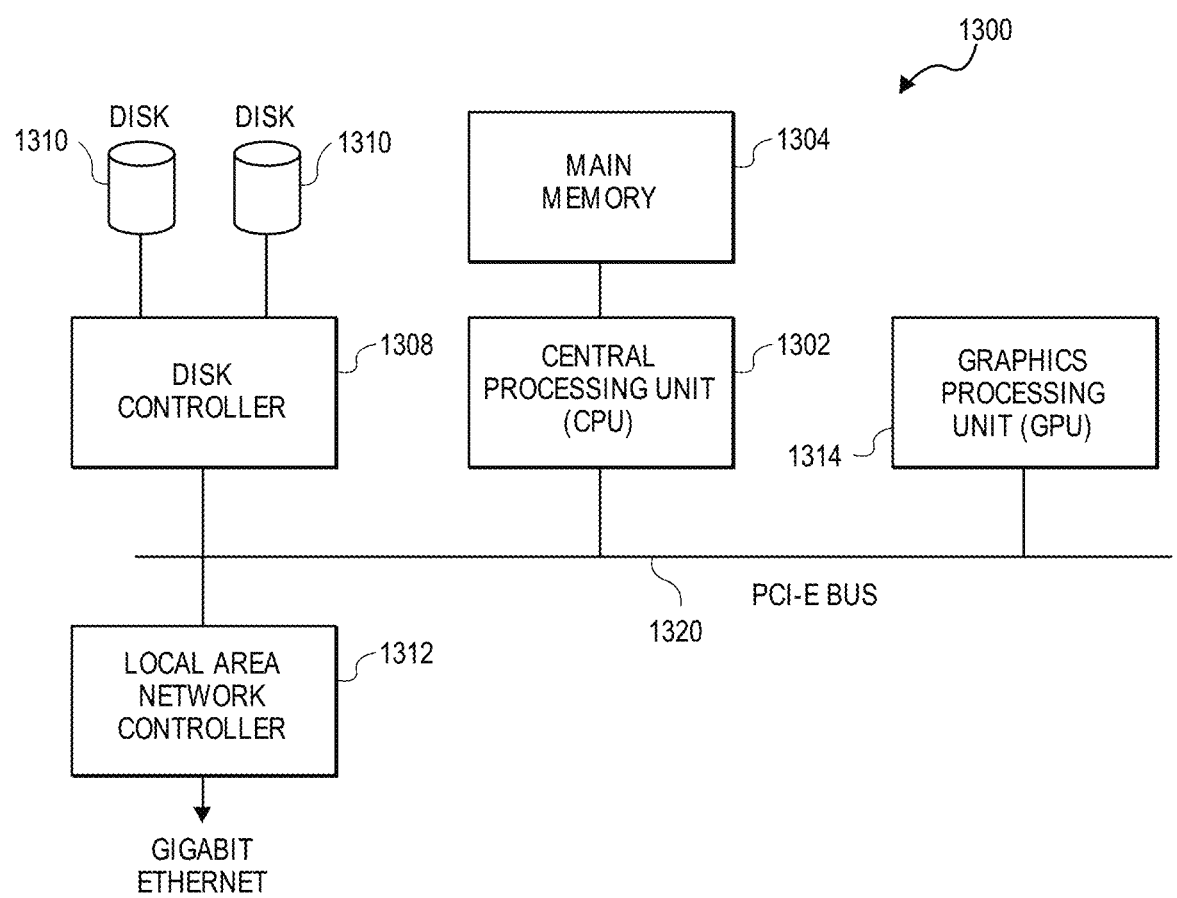
FIG. 13 is a block diagram of a computing hardware system that may be used in the present disclosure, in accordance with embodiments.

FIG. 13 is a block diagram of an example of a computing hardware device 1300 that may be used to perform the calculations described in this disclosure. Computing hardware device 1300 comprises a central processing unit (CPU) 1302, with attached main memory 1304. The CPU 1302 may comprise, for example, eight processing cores, thereby enhancing performance of any parts of the computer software that are multi-threaded. The size of main memory 1304 may be, for example, 64 G-Bytes. The CPU 1302 is connected to a Peripheral Component Interconnect Express (PCIe) bus 1320. A graphics processing unit (GPU) 1314 may also be connected to the PCIe bus 1320. In computing hardware device 1300, the GPU 1314 may or may not be connected to a graphics output device such as a video monitor. If not connected to a graphics output device, GPU 1314 may be used purely as a high-speed parallel computation engine. The computing software may obtain significantly higher performance by using GPU 1314 for a portion of the calculations, compared to using CPU 1302 for all the calculations. The CPU 1302 communicates with the GPU 1314 via PCIe bus 1320. In other embodiments (not illustrated) GPU 1314 may be integrated with CPU 1302, rather than being connected to PCIe bus 1320. Disk controller 1308 may also be attached to the PCIe bus 1320, with, for example, two disks 1310 connected to disk controller 1308. Finally, a local area network (LAN) controller 1312 may also be attached to the PCIe bus, and provide Gigabit Ethernet (GbE) connectivity to other computers. In some embodiments, the computer software and/or the design data are stored on disks 1310. In other embodiments, either the computer programs or the design data or both the computer programs and the design data may be accessed from other computers or file serving hardware via the GbE Ethernet or other connectivity solutions such as Infiniband.

Figure 14:
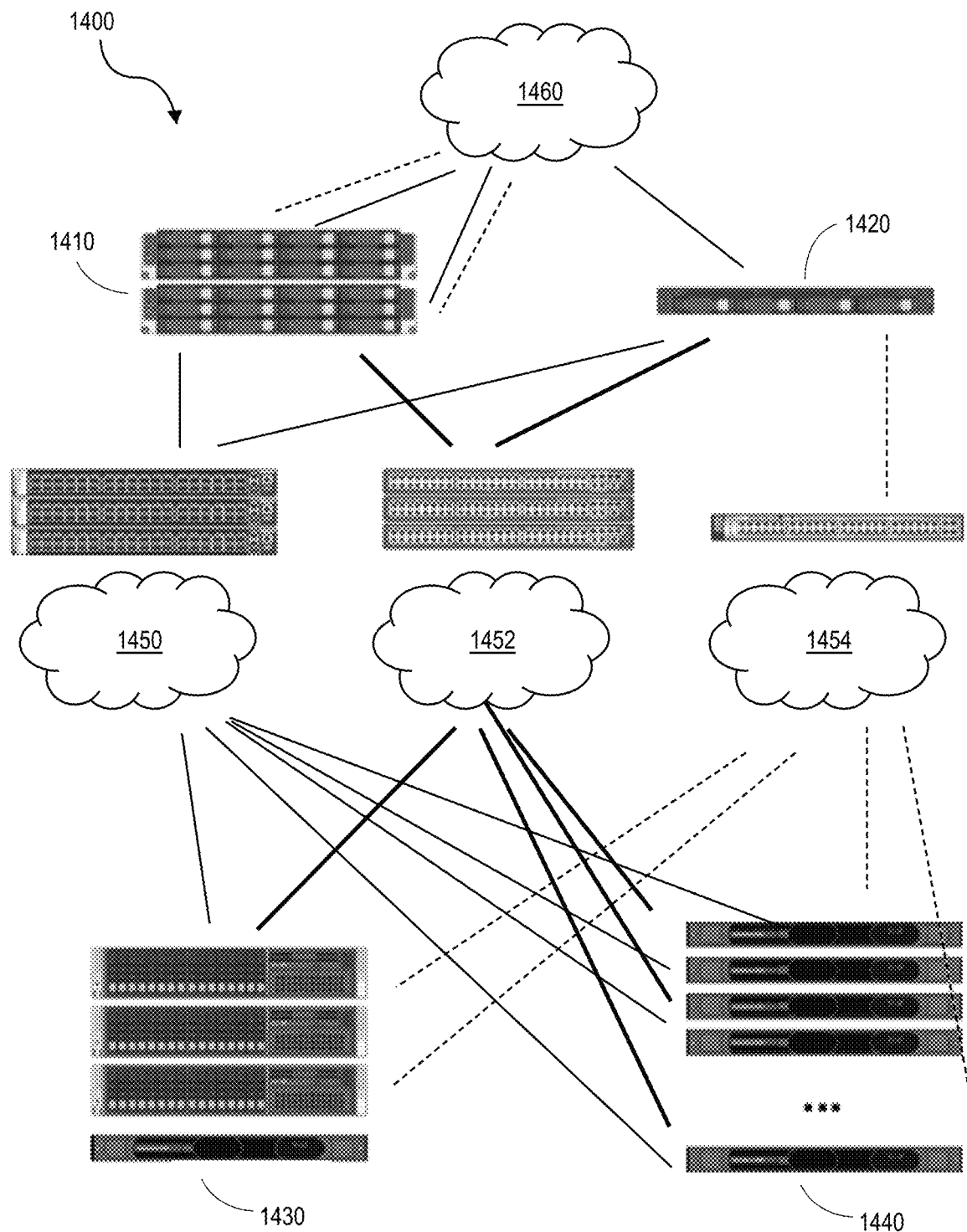
FIG. 14 is a block diagram of another embodiment of a computing hardware system, a Computational Design Platform (CDP), in accordance with embodiments.

FIG. 14 is another embodiment of a system for performing the computations of the present embodiments. The system 1400 may also be referred to as a Computational Design Platform (CDP), and includes a master node 1410, an optional viewing node 1420, an optional network file system 1430, and a GPU-enabled node 1440. Viewing node 1420 may not exist or instead have only one node, or may have other numbers of nodes. GPU-enabled node 1440 can include one or more GPU-enabled nodes. Each GPU-enabled node 1440 may be, for example, a GPU, a CPU, a paired GPU and CPU, multiple GPUs for a CPU, or other combinations of GPUs and CPUs. The GPU and/or CPU may be on a single chip, such as a GPU chip having a CPU that is accelerated by the GPU on that chip, or a CPU chip having a GPU that accelerates the CPU. A GPU may be substituted by other co-processors.

The master node 1410 and viewing node 1420 may be connected to network file system 1430 and GPU-enabled nodes 1440 via switches and high-speed networks such as networks 1450, 1452 and 1454. In an example embodiment, networks 1450 can be a 56 Gbps network, 1452 can be a 1 Gbps network and 1454 can be a management network. In various embodiments, fewer or greater numbers of these networks may be present, and there may be various combinations of types of networks such as high and low speeds. The master node 1410 controls the CDP system 1400. Outside systems can connect to the master node 1410 from an external network 1460. In some embodiments, a job is launched from an outside system. The data for the job is loaded onto the network file system 1430 prior to launching the job, and a program is used to dispatch and monitor tasks on the GPU-enabled nodes 1440. The progress of the job may be seen via a graphical interface, such as the viewing node 1420, or by a user on the master node 1410. The task is executed on the CPU using a script which runs the appropriate executables on the CPU. The executables connect to the GPUs, run various compute tasks, and then disconnect from the GPU. The master node 1410 can also be used to disable any failing GPU-enabled nodes 1440 and then operate as though that node did not exist.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed:

1. A method for reticle enhancement technology (RET) for transferring a pattern to a substrate, the method comprising:
    inputting a mask exposure information, the mask exposure information comprising information to expose the pattern on the substrate;
    calculating a mask 2D (M2D) effect from the mask exposure information;
    using a neural network to determine a mask 3D (M3D) effect from the M2D effect, wherein determining the M3D effect includes determining a variable side wall angle (VSA);
    calculating a calculated pattern on the substrate using the M3D effect; and
    modifying the mask exposure information based on the calculated pattern on the substrate.

2. The method of claim 1, wherein the calculating the calculated pattern on the substrate includes lithography simulation.

3. The method of claim 1, wherein the calculating the M2D effect comprises inverse lithography technology (ILT).

4. The method of claim 1, further comprising:
inputting a target substrate pattern; and
calculating the mask exposure information from the target substrate pattern using reticle enhancement technology (RET) prior to inputting the mask exposure information.

5. The method of claim 4, wherein the RET comprises inverse lithography technology (ILT).

6. The method of claim 1, wherein the mask exposure information further comprises optical proximity correction (OPC).

7. The method of claim 1, wherein the calculating of the calculated pattern on the substrate comprises extreme ultraviolet (EUV) simulation.

8. The method of claim 1, wherein the determining the M3D effect includes calculating a dose margin from the mask exposure information.

9. The method of claim 1, wherein determining the M3D effect uses a transfer function.

10. The method of claim 1, wherein the mask exposure information is for multi-beam.

11. The method of claim 1, further comprising iterating the calculating the M2D effect, the determining the M3D effect, the calculating the calculated pattern and the modifying.

12. A method for calculating a pattern to be formed on a substrate using optical lithography with a mask, the method comprising:
inputting a mask exposure information that will form the pattern on the mask;
determining a dose margin from the mask exposure information;
calculating a variable side wall angle (VSA) using the dose margin; and
calculating the pattern on the substrate using the VSA, wherein the calculating the pattern on the substrate includes a mask 3D (M3D) effect;
wherein the variable side wall angle is calculated using a neural network.

13. The method of claim 12, wherein the calculating the pattern on the substrate comprises lithography simulation.

14. The method of claim 12, wherein the calculating the pattern on the substrate comprises extreme ultraviolet (EUV) simulation.

15. The method of claim 12, wherein the pattern on the substrate is for a semiconductor device.

16. The method of claim 12, further comprising calculating the mask from the mask exposure information, and wherein the calculating the pattern on the substrate uses the mask.

17. A system for reticle enhancement technology (RET) comprising:
a device configured to receive a mask exposure information, the mask exposure information comprising information to expose a pattern on a substrate;
a device configured to calculate a mask 2D (M2D) effect from the mask exposure information;
a device configured to use a neural network to determine a mask 3D (M3D) effect from the M2D effect, wherein determining the M3D effect includes determining a variable side wall angle (VSA); and
a device configured to calculate a calculated pattern on the substrate using the M3D effect.

18. The system of claim 17, wherein the device configured to calculate the M2D effect and the device configured to use the neural network to determine the M3D effect from the M2D effect comprises a graphics processing unit (GPU).

* * * * *